United States Patent [19]
Kinzer et al.

[11] Patent Number: 5,844,259
[45] Date of Patent: Dec. 1, 1998

[54] VERTICAL CONDUCTION MOS CONTROLLED THYRISTOR WITH INCREASED IGBT AREA AND CURRENT LIMITING

[75] Inventors: Daniel M. Kinzer; Weizuo Zhang, both of El Segundo, Calif.

[73] Assignee: International Rectifier Corporation, El Segundo, Calif.

[21] Appl. No.: 618,350

[22] Filed: Mar. 19, 1996

[51] Int. Cl.$^6$ .......................... H01L 29/74; H01L 31/111
[52] U.S. Cl. .................. 257/147; 257/138; 257/151; 257/152; 257/153
[58] Field of Search .................... 257/138, 147, 257/151, 152, 153

[56] References Cited

U.S. PATENT DOCUMENTS

| | | |
|---|---|---|
| 5,243,201 | 9/1993 | Bauer . |
| 5,260,590 | 11/1993 | Temple . |
| 5,281,833 | 1/1994 | Ueno ........................................ 257/147 |
| 5,381,025 | 1/1995 | Zommer . |

FOREIGN PATENT DOCUMENTS

| | | | |
|---|---|---|---|
| 1003078 | 3/1991 | European Pat. Off. ................ 257/147 |
| 0614228 | 9/1994 | European Pat. Off. ................ 257/147 |
| 4099384 | 3/1992 | Japan ...................................... 257/147 |

OTHER PUBLICATIONS

V.A.K. Temple, "MOS–Controlled Thyristors (MCTs)", International Electron Devices Meeting (IEDM) Technical Digest, pp. 282–285, San Francisco, Dec. 1984.

K.K. Afridi and J.G. Kassakian, "Turn–Off Failures in Individual and Paralleled MCTs", Proceedings of the ISPSD, pp. 60–65, 1993.

H. Lendenmann et al., "Approaching homogeneous switching of MCT devices: Experiment and Simulation", Proceedings of the ISPSD, pp. 66–70, 1993.

M. Nandakumar, et al., "The Base–Resistance–Controlled Thyristor (BRT): A New MOS–Gated Power Thyristor".

V.A.K. Temple et al, "Preview of Second Generation P–MCT", Proceedings of the PCIM, pp. 161–167, Sep. 1994.

*Primary Examiner*—Wael Fahmy
*Assistant Examiner*—Fetsum Abraham
*Attorney, Agent, or Firm*—Ostrolenk, Faber, Gerb & Soffen, LLP

[57] ABSTRACT

An MCT is formed as a four-layer device, using alternating cells of: (a) P diffusions in an N$^-$ wafer having lower N$^+$ and P$^+$ layers with N$^+$ cathode regions in the P diffusions, and (b) shallow P$^+$ diverter cells. A cathode electrode is connected to the N$^+$ cathodes, but not to the P diffusions containing the N$^+$ cathode regions. The alternating cells are arranged in checkerboard fashion with the cells of any given row having a narrow spacing to define a narrow turn-off channel and the rows being more widely spaced to define a conduction channel having a reduced inherent JFET resistance.

14 Claims, 5 Drawing Sheets

FIG. 8

VERTICAL CONDUCTION MOS CONTROLLED THYRISTOR WITH INCREASED IGBT AREA AND CURRENT LIMITING

FIELD OF THE INVENTION

This invention relates to MOS controlled thyristors ("MCT"), and more specifically relates to a vertical conduction MCT in which the device cells are arranged in checkerboard fashion.

BACKGROUND OF THE INVENTION

MCT devices are well known and are shown, typically in U.S. Pat. Nos. 5,243,201, 5,260,590 and 5,381,025. Such devices are useful in having a high reverse breakdown voltage and a high forward current and in being turned on and off by a MOSgate control. MCTs, which are insulated gate thyristors, are of great interest for high voltage power switching applications. In general, the principle of their operation consists of allowing an on-state current to flow via a thyristor region, which can be switched off by a signal applied to the gate of an MOS structure that is integrated into the thyristor structure. This concept has the advantages of low forward drop and ease of control. Examples of device structures that achieve this function are the MCT described in V.A.K. Temple, "MOS-Controlled Thyristors (MCTs)", IEEE Electron Device Meeting (IEDM) Technical Digest, pp. 282–285, San Francisco, December 1984 and the BRT device described in M. Nandakumar, B. J. Baliga et al, "The Base Resistance Controlled Thyristor (BRT): A New MOS Gated Power Thyristor", Proceedings of the ISPSD, pp. 138–141, 1991. In these structures, a P-channel MOSFET is used to divert the thyristor current to a grounded $P^+$ region to turn-off the thyristor. MCTs have triple-diffused structures with the turn-off P-channel MOSFET integrated into the N emitter region. Non-uniform turn-off has been shown to limit the maximum controllable current for large-area thyristor structures as described in K. K. Afridi and J. G. Kassakian, "Turn-Off Failures in Individual and Paralleled MCTs", Proceedings of the ISPSD, pp. 60–65, 1993. Careful design of large die has overcome this limitation for MCTs and P-MCTs have become commercially available with blocking voltages of 600V and controllable currents of 75 amperes as described in V. A. K. Temple et al, "Preview of Second Generation P-MCT", Proceedings of the PCIM, pp. 161–167, September 1994. N-MCTs have also been reported with lower controllable current and with blocking voltages greater than 1200V as described in H. Lendenmann et al, "Approaching homogeneous switching of MCT devices: Experiment and Simulation", Proceedings of the ISPSD, pp. 66–70, 1993. However, the experimental results reported for double-diffused structures with the turn-off p-channel MOSFET integrated into the $N^-$ base region like the BRT have been limited to lower current test structures (less than 10 amperes) and with blocking voltages of 600V.

BRIEF DESCRIPTION OF THE INVENTION

In accordance with the invention, a four-layer device of the base-emitter short type is formed, in which a checkerboard pattern of diverter (or shorting) cells is interspersed with cathode cells. A high density of MOS gates is realized in this design which provides a low channel resistance for the turn-off p-channel MOSFET and hence a high controllable current density. The cathode cells each consist of a P type base region which contains an $N^+$ cathode type region. The P type base region is not connected to the cathode contact and the $P^+$ diverter cell is shorted through a $P^-$ inversion channel when a PMOS turn-off device is turned on. The gap in the polysilicon between rows of cathode cells and adjacent diverter cells defines the turn-off channel and is relatively small to make it easier for the turn-off process, and to keep turn-off resistance low. The gap between ranks of such cells is relatively large to reduce the parasitic JFET resistance in the "on-channel".

Other features and advantages of the present invention will become apparent from the following description of the invention which refers to the accompanying drawings.

DETAILED DESCRIPTION OF THE DRAWINGS

Figure 1:
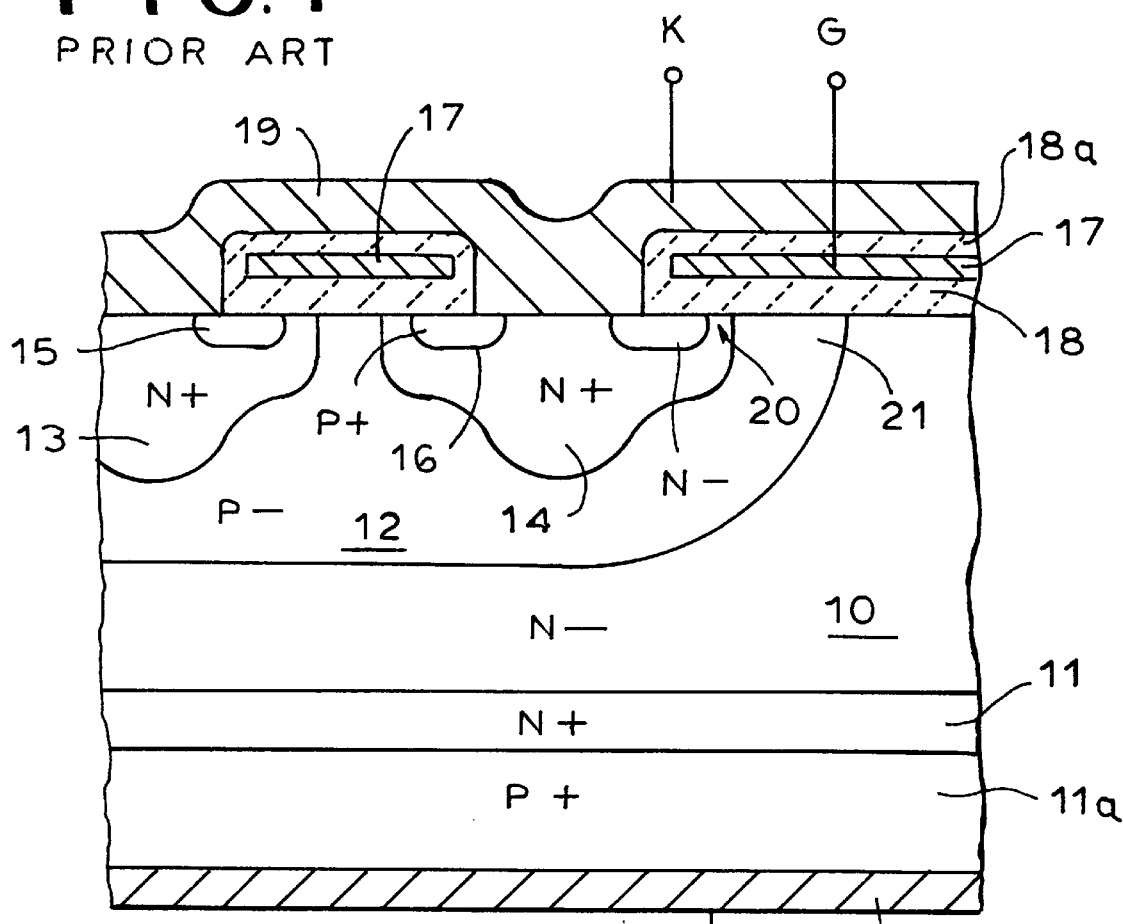
FIG. 1 shows a cross-section of a portion of the chip of a prior art MCT.

Referring first to FIG. 1, there is shown a prior art MCT device, which is a five-layer P-N-P-N-P device requiring three diffusions. The device consists of an $N^-$ silicon wafer 10 having an $N^+$ layer 11, a $P^+$ layer 11a, a $P^-$ well 12 and a large number of $N^+$ base regions 13, 14 formed in $P^-$ well 12. Each of base regions 13, 14 contains respective $P^+$ source rings 15 and 16 respectively. A polysilicon gate 17 is patterned as shown and is deposited over a gate oxide layer 18. An interlayer oxide 18a covers the polysilicon gate 17 and insulates it from a cathode contact 19 which overlies and contacts the exposed $N^+$ bases 13, 14 and their $P^+$ source rings at the silicon surface as shown. An anode contact 20a is connected to the bottom of the chip 10.

Figure 2:
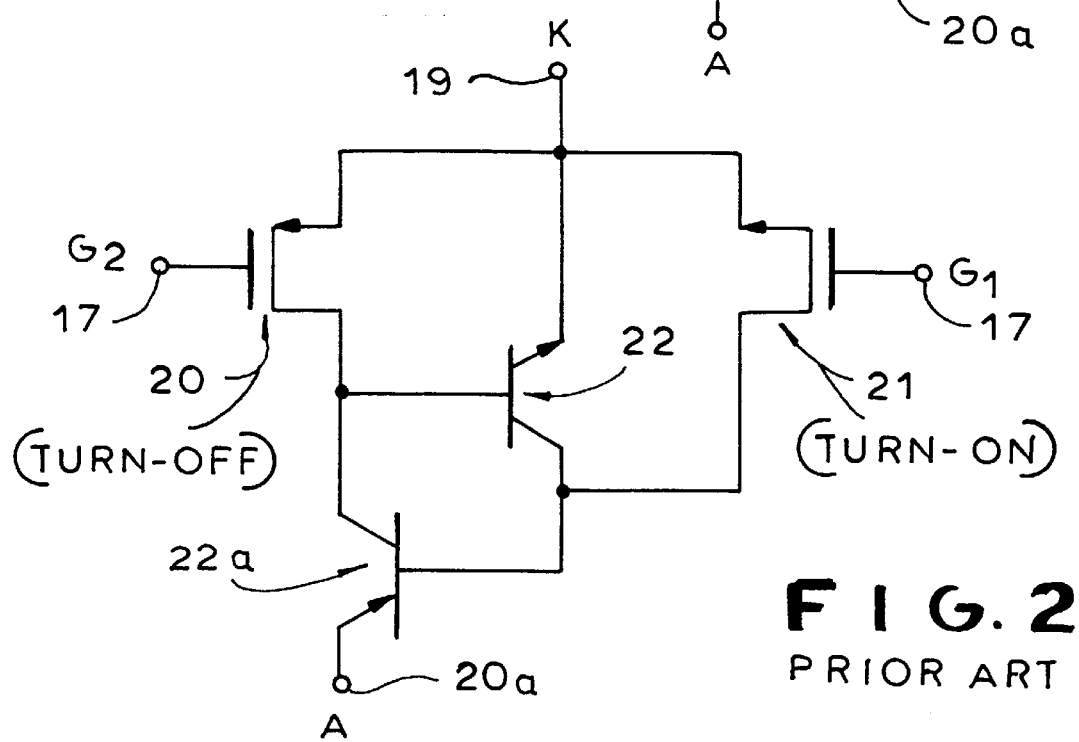
FIG. 2 is an equivalent circuit diagram of the prior art chip of FIG. 1.

In the structure described above, the channel 20 is a turn-off FET channel, represented by the P channel MOSFET 20 in FIG. 2. The channel 21 in FIG. 1 is the turn-on FET channel, represented by the N channel FET 21 in FIG. 2. The gates G and $G_2$ of FETs 20 and 21 in FIG. 2 are connected together and each represents gate 17 of FIG. 1.

The device of FIGS. 1 and 2 operates so that a positive gate voltage on gate 17 turns FET 21 on to short out the emitter to collector regions of PNP thyristor transistor 22. This turns on NPN thyristor transistor 22a which injects into the base of the transistor 22 to turn on the device. To turn off the device, a negative voltage on gate 17 turns on FET 20 to short the emitter-base junction of transistor 22, turning it off and turning off the device.

Thus, the device of FIGS. 1 and 2 achieves current control by shorting the base-emitter circuit of transistor 22.

Therefore, the P channel shorting transistor 20 must have the lowest $R_{DON}$ possible to achieve a maximum controllable current. This implies a high cell density for the bases 13, 14 of the turn off FET 20. Accordingly, the prior art device has on/off control only but no current limiting action.

Figure 3:
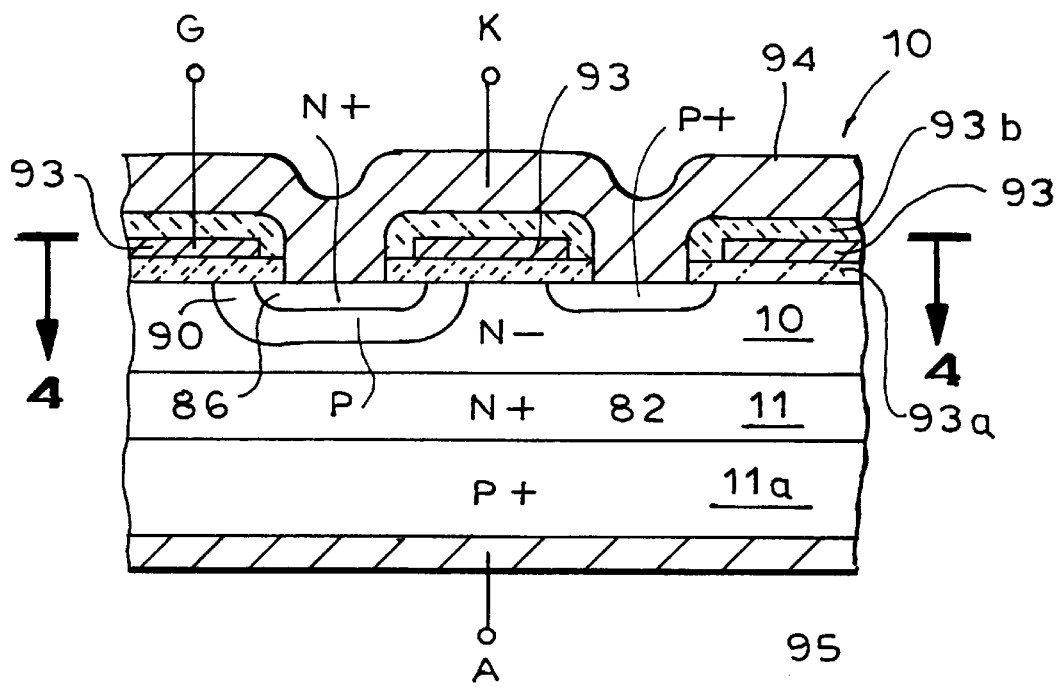
FIG. 3 is a cross-section of FIG. 4 taken across section lines 3—3 in FIG. 4 and shows the invention in which the prior art device of FIG. 1 is implemented as a four-layer device.
Figure 4:
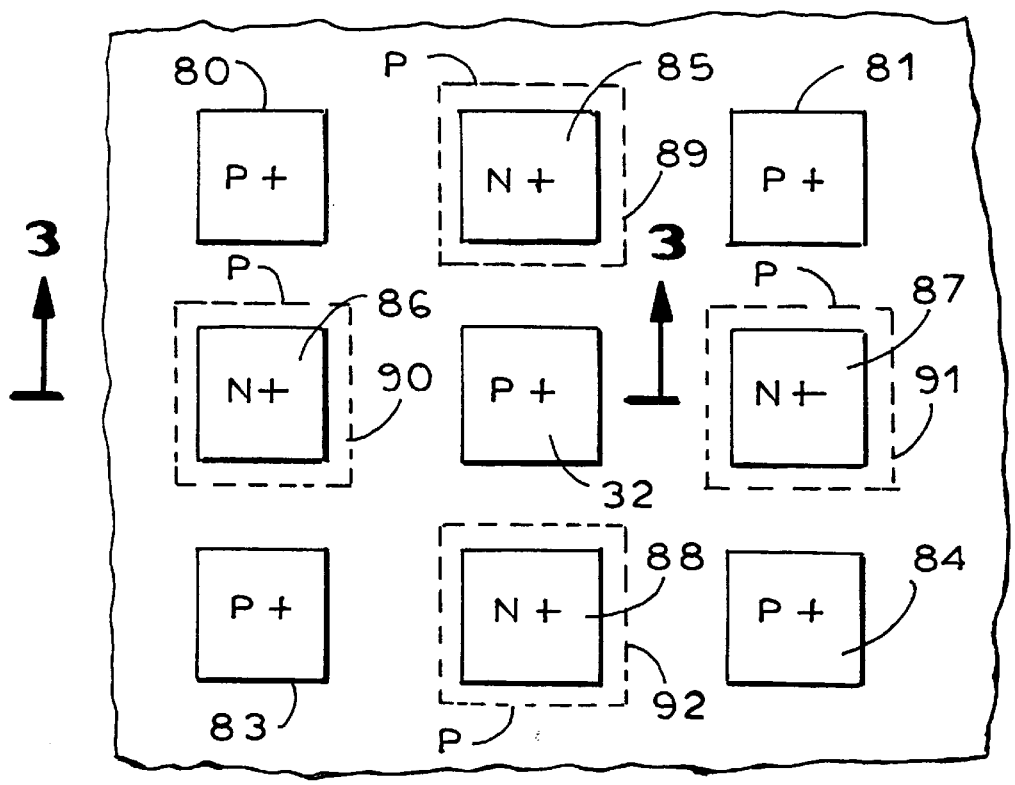
FIG. 4 is a cross-section of FIG. 3 taken across section lines 4—4 in FIG. 3.
Figure 5:
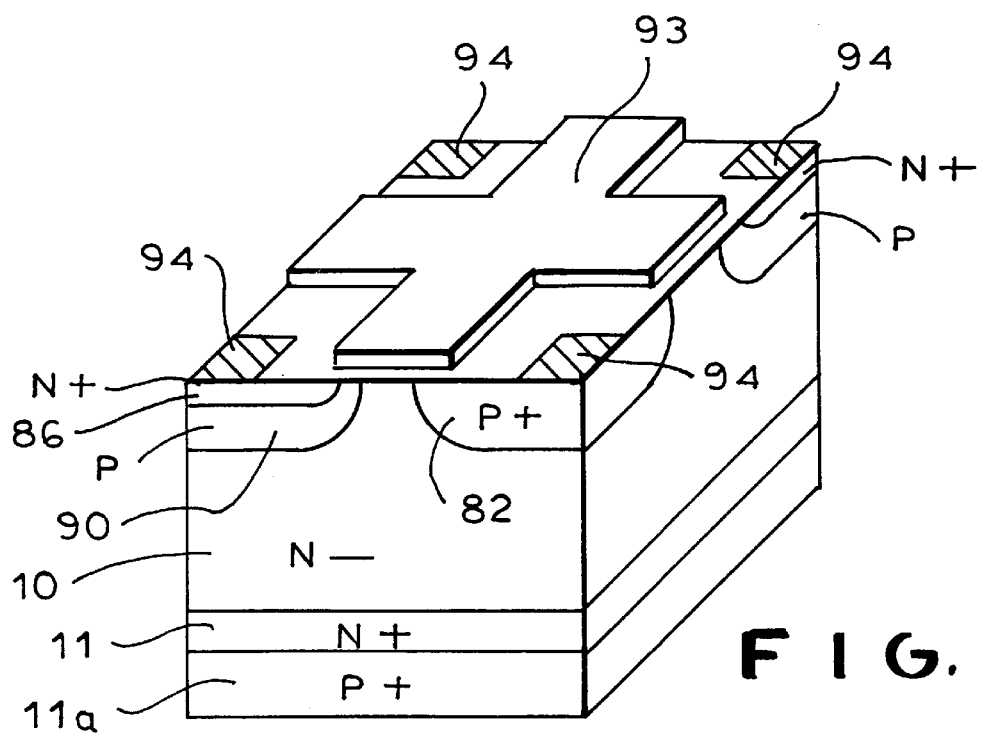
FIG. 5 shows a unit cell of the device of FIGS. 3 and 4 in perspective view.

In accordance with the present invention, a novel combined IGBT and thyristor pattern is formed in a chip, as shown in FIGS. 3, 4 and 5. Numerals in FIGS. 3, 4 and 5 similar to those of FIGS. 1 and 2 identify similar parts.

Referring to FIGS. 3, 4 and 5, the chip is an $N^-$ starting wafer 10 and has $N^+$ and $P^+$ diffusions 11 and 11a respectively, as in FIG. 1.

FIGS. 3, 4 and 5 show a preferred embodiment of the invention in which the prior art device of FIGS. 1 and 2 is carried out in a four-layer structure. The N chip 10 contains a checkerboard-like layout of rows of shallow $P^+$ cells 80, 81, 82, 83 and 84 in alternate checkerboard positions with $N^+$ emitter regions 85 to 88 in alternate positions. Three ranks 80, 86, 83; 85, 82, 88; and 81, 87, 84 of checkerboard geometry are also defined. Each $N^+$ region 85 to 88 is contained within respective P type channel regions 89 to 92. The device is completed by a polysilicon gate 93, gate oxide 93a and interlayer oxide 93b and cathode and anode electrodes 94 and 95, respectively.

Note that the cathode contact 95 does not contact P regions 89 to 92 and thus does not short the regions 86 and 90 (FIG. 3). Thus, P regions 89 to 92 are floating regions. By contrast, in the device of U.S. Pat. No. 5,381,025, the corresponding N and P regions are shorted which results in a reduction of the emitter efficiency.

In the device of FIGS. 3, 4 and 5, a representative design would have cell pitch of about 8 microns, and a poly line width of about 3 microns. The $P^+$ regions may have a depth of from 1.0 to 1.5 microns, and the $N^+$ regions have a depth of about 0.5 microns.

Figure 6:
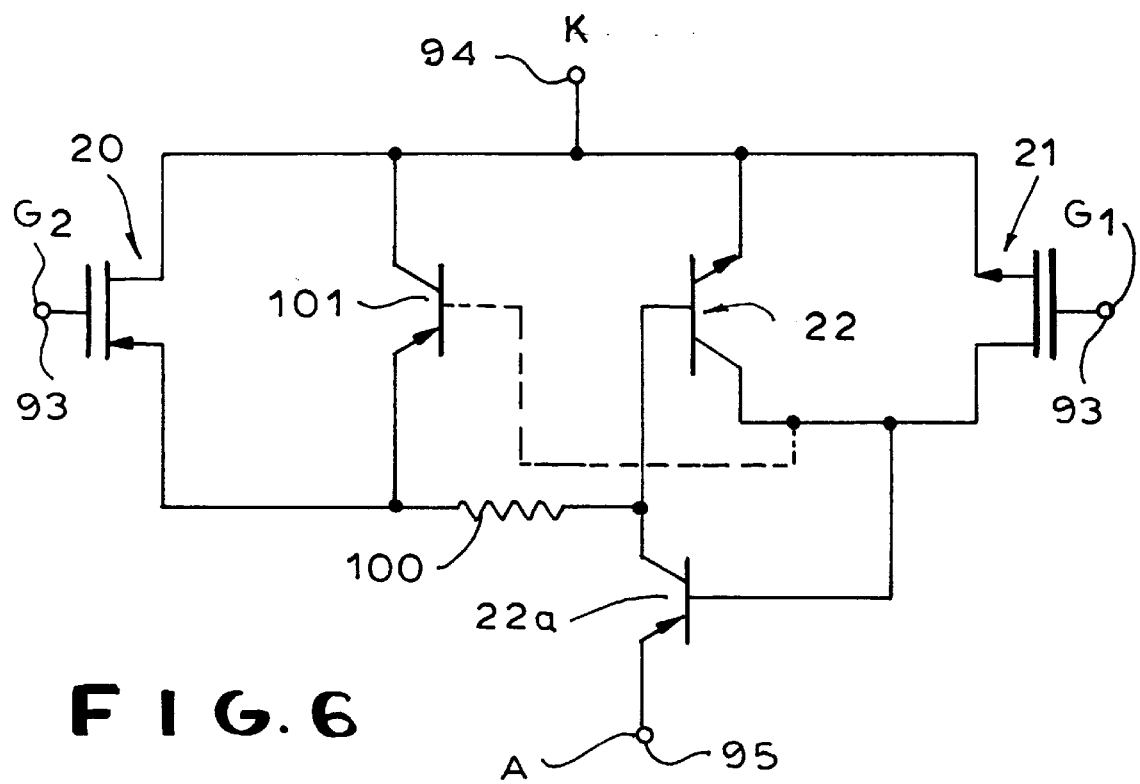
FIG. 6 is an equivalent circuit diagram of the device of FIGS. 3, 4 and 5.

The device of FIGS. 3, 4 and 5 has the equivalent circuit shown in FIG. 6.

In the circuit of FIG. 6, there is shown the thyristor transistors 22 and 22a, formed by regions 94, 86 and 90; and 82, 10–11 and 11a respectively of FIGS. 3, 4 and 5. The turn off FET 20 is the FET formed of regions 82, 10, 90 and the turn-on FET 21 is formed by regions 86, 90, 10. The resistor 100 is the lateral resistance of $P^-$ region 90, and parasitic transistor 101 is connected as shown.

Figure 7A:
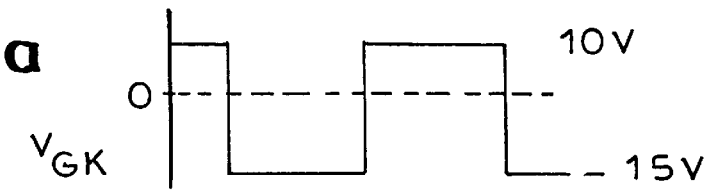
FIGS. 7a, 7b and 7c show the gate voltage, anode-to-cathode voltage and anode-to-cathode current respectively for the device of FIGS. 3, 4 and 5.
Figure 7B:
Figure 7C:
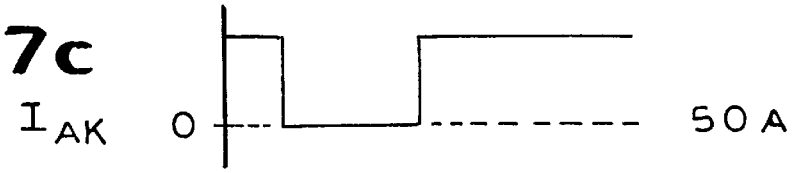

The operation of the device of FIGS. 3 to 6 is shown in FIGS. 7a, 7b and 7c on a common time scale. Thus, when the potential of gate 93 is raised to 10 volts positive, the on-FET 21 of FIG. 6 turns on to turn on the thyristor transistor 22a, thus turning on the thyristor between terminals 94 and 95. To turn off the device, the gate 93 of FIG. 6 is biased to (–)15V, thus turning on the FET 20. FET 20 then shorts the base-emitter circuit of thyristor 22, to turn off the main thyristor.

Figure 8:
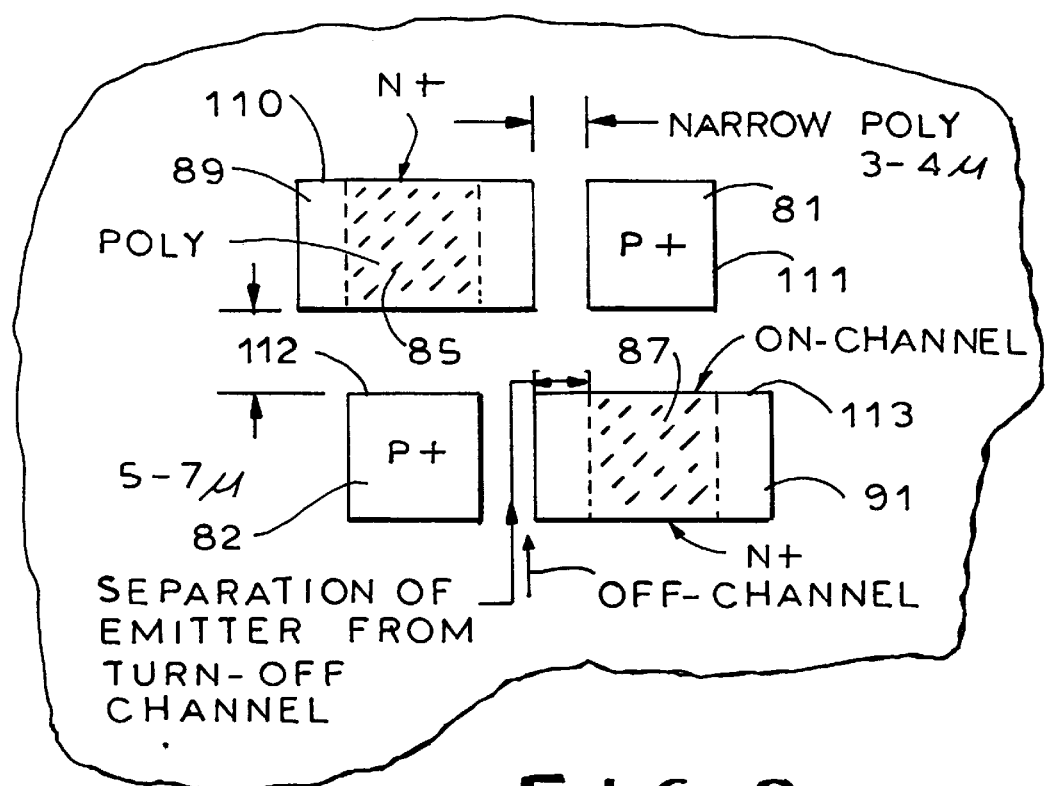
FIG. 8 shows an improved design for the arrangement of rows and ranks of cells to improve turn-off operation.

The arrangement of cells in FIG. 4 is shown with generally identical spacings for the ranks and rows of cells. FIG. 8 shows a modified arrangement for the cells containing the $N^+$ regions in which the windows in the polysilicon 93 are laterally elongated in each row with the adjacent cells in each row being closer than the cells of adjacent rows or ranks. More specifically, as shown in FIG. 8, windows are shown in polysilicon 93, including windows 110, 111, 112 and 113. Windows 111 and 112 receive the $P^+$ diffusions 81 and 82, shown in FIG. 4. Windows 110 and 113 receive the P diffusions 89 and 91 of FIG. 4 and the N diffusions 85 and 87 of FIG. 4. Windows 110 and 111 are in one row of identically arranged windows and are narrowly spaced, for example, by about 3 to 4 microns. This space defines the turn-off channel for the turn-off PMOS device 20. The reduction in the polysilicon width, or channel length, reduces its resistance.

The distance between rows of windows is preferably widened, for example, to about 5 to 7 microns. The space between rows represents the on-conduction channel, and the wider spacing reduces the JFET resistive pinch. However, the device is still only a four layer device and is therefore much more easily fabricated than that of FIG. 1.

Significantly, the emitter diffusions 85 to 88 are pulled away or separated from the turn-off channel as best shown in FIG. 8. This prevents excessive carrier injection into the turn-off region and allows inversion to be successfully performed by the turn-off drive voltage. Note that this novel feature is universally applicable to any MOSgated device.

Figure 9:
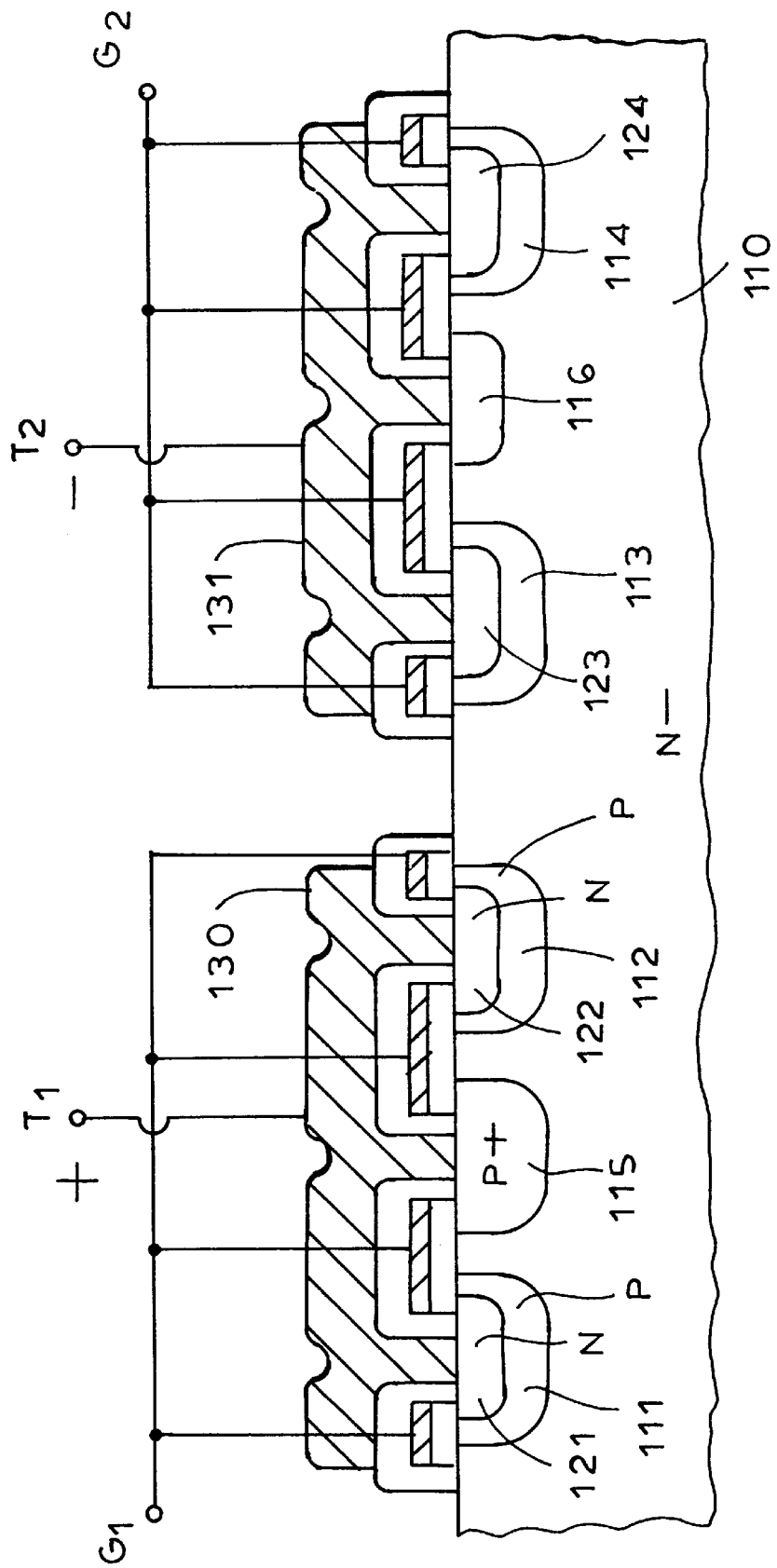
FIG. 9 shows a cross-section of a further embodiment of the invention, carried out in lateral form.

Referring next to FIG. 9, which is the lateral counterpart of the device of FIGS. 3 and 4, an $N^-$ silicon chip 110 receives a plurality of spaced P type channel diffusions 111 to 114 distributed over the surface of the chip. $P^+$ diffusions 115 and 116 are disposed in diffusions 111–112 and 113–114 respectively. Channel regions 111 to 114 receive respective $N^+$ source regions 121 to 124.

Polysilicon gate segments overlie gate oxide layers as shown in FIG. 9, and all gates for channel regions 111 and 112 are connected together at terminal $G_1$. Similarly, the polysilicon gates for channel regions 113 and 114 are connected together at gate $G_2$.

A first aluminum contact 130 overlies the channels 111 and 112 and contacts N regions 121 and 122 and $P^+$ region 115. Contact 130 is insulated from the polysilicon gate electrodes by a suitable interlayer oxide. Similarly, a second aluminum contact 131 overlies channels 113 and 114 and contacts $N^+$ regions 123 and 124 and $P^+$ region 116.

The operation of the device of FIG. 9 is similar to that of FIGS. 3 and 4. Thus, terminals $T_1$ and $T_2$ correspond to terminals K and A respectively in FIG. 2. Gates $G_1$ and $G_2$ of FIG. 9 are also like gates $G_1$ and $G_2$ in FIG. 2, but are not connected together.

In the device of FIG. 9, holes will travel laterally, for example, from P region 112 to P regions 113 and 116 during operation. Also, gates $G_1$ and $G_2$ are in antiphase relation to achieve bidirectional thyristor action. Thus, to turn on the device of FIG. 9, gate $G_1$ is made negative and gate $G_2$ is made positive. To turn the device off, gate $G_1$ is made positive and gate $G_2$ is made negative.

During turn-off, the emitters of the anode and cathode are both shorted. A four-layer thyristor becomes a reverse-biased diode and exhibits a fast turn-off performance. It also works as a fast switching bidirectional MCT because of its symmetrical characteristics.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A four-layer MCT device comprising a thin chip of silicon having a bottom layer of $P^+$ concentration, a layer of $N^+$ concentration above said bottom layer, an $N^-$ body layer above said $N^+$ layer, a plurality of first spaced cells each including a P type channel diffusion formed in said $N^-$ body layer and an $N^+$ cathode diffusion region received in said P type channel diffusion; a plurality of second spaced cells each including a $P^+$ diffusion; and a cathode electrode connected to said N⁺ cathode diffusions and insulated from said P type channel diffusions; said first spaced cells being interspersed with said second spaced cells in a checkerboard pattern that includes spaced rows which are each comprised of alternating first and second spaced cells; the distance between adjacent ones of said spaced rows being treater than the distance between adjacent ones of said first and second spaced cells within a respective row.

2. The device of claim 1, which further includes at least one MOS gate disposed atop the channels formed between said P type channel diffusions and their said respective N⁺ cathode diffusions and disposed atop the space between adjacent ones of said P channel regions and said P⁺ diffusions.

3. The device of claim 2, which further contains an anode contact connected to said P⁺ bottom layer.

4. The device of claim 1, which further contains an anode contact connected to said P⁺ bottom layer.

5. The device of claim 1, wherein each of said cellular P type channel diffusions in each of said rows has a substantially rectangular shape in which said P type channel diffusions extend beyond the borders of their respective said N⁺ cathode diffusion.

6. The device of claim 5, wherein a respective one of said first spaced cells in one of said spaced rows and an adjacent one of said second spaced cells in an adjacent one of said spaced rows are separated by an on-conduction channel which has a relatively large length to reduce the JFET resistance of said on-conduction channel.

7. The device of claim 6, wherein said length is about 5 to 7 microns.

8. The device of claim 6, wherein said N⁺ cathode diffusions of said first spaced cells are spaced from the boundary between their respective P type channel diffusion and said N⁻ body layer by a small distance to reduce the injection of minority carriers into the space between said P type channel diffusions and said P⁺ diffusions of adjacent second spaced cells within a respective row.

9. The device of claim 1, wherein said N⁺ cathode diffusions of said first spaced cells are spaced from the boundary between their respective P type channel diffusion and said N⁻ body layer by a small distance to reduce the injection of minority carriers into the space between said P type channel diffusions and said P⁺ diffusions of adjacent second spaced cells within a respective row.

10. The device of claim 1 wherein, within a respective one of said rows, said P type channel diffusion of one of said first spaced cells, said P⁺ diffusion of an adjacent one of said second spaced cells and the space therebetween forms a PMOS device in which the length of said space is relatively small to reduce the resistance of said PMOS device.

11. The device of claim 10, wherein said length is about 3 to 4 microns.

12. The device of claim 11, wherein a respective one of said first spaced cells in one of said spaced rows and an adjacent one of said second spaced cells in an adjacent one of said spaced rows are separated by an on-conduction channel which has a relatively large length to reduce the JFET resistance of said on-conduction channel.

13. The device of claim 12, wherein said length is about 5 to 7 microns.

14. The device of claim 11, wherein said N⁺ cathode diffusions of said first spaced cells are spaced from the boundary between their respective P type channel diffusion and said N⁻ body layer by a small distance to reduce the injection of minority carriers into the space between said P type channel diffusions and said P⁺ diffusions of adjacent second spaced cells within a respective row.

* * * * *